United States Patent
Park et al.

(10) Patent No.: US 12,072,485 B2
(45) Date of Patent: Aug. 27, 2024

(54) CAPACITIVE ANGLE SENSING OF ELECTROSTATIC MEMS MIRRORS

(71) Applicant: GOOGLE LLC, Mountain View, CA (US)

(72) Inventors: Sangtak Park, Mountain View, CA (US); Matthew Wakelin, Kitchener (CA); Jordan Van Wyk, Waterloo (CA)

(73) Assignee: GOOGLE LLC, Mountain View, CA (US)

( * ) Notice: Subject to any disclaimer, the term of this patent is extended or adjusted under 35 U.S.C. 154(b) by 535 days.

(21) Appl. No.: 17/220,627

(22) Filed: Apr. 1, 2021

(65) Prior Publication Data

US 2022/0269070 A1 Aug. 25, 2022

Related U.S. Application Data

(60) Provisional application No. 63/004,616, filed on Apr. 3, 2020.

(51) Int. Cl.
*G02B 26/08* (2006.01)
*B81B 3/00* (2006.01)

(52) U.S. Cl.
CPC ........ *G02B 26/0841* (2013.01); *B81B 3/0083* (2013.01); *B81B 2201/047* (2013.01)

(58) Field of Classification Search
CPC .............. G02B 26/0841; B81B 3/0083; B81B 2201/047

USPC ......... 359/212.1, 212.2, 213.1, 214.1, 223.1, 359/224.1, 224.2, 225.1, 226.1, 226.2, 359/290, 291, 292, 295, 298
See application file for complete search history.

(56) References Cited

U.S. PATENT DOCUMENTS

2019/0377136 A1\* 12/2019 Fluegel .................. G02B 6/357
2020/0018948 A1\* 1/2020 Steiner ................. G02B 26/101

FOREIGN PATENT DOCUMENTS

WO    WO-2009044360 A1 \*  4/2009  ......... G02B 26/0833

\* cited by examiner

*Primary Examiner* — William Choi

(57) ABSTRACT

A system includes an optical reflector to reflect the light, the optical reflector having a rotor, a first stator, and a second stator. The system further includes a controller in communication with the optical reflector. The controller is to drive the optical reflector by applying a first actuation voltage to the first stator, and a second actuation voltage to the second stator. Further, the controller is to apply an excitation voltage to the first stator. Furthermore, the controller is to determine a relationship between a first capacitance between the rotor and the first stator, and a second capacitance between the rotor and the second stator. Based on the relationship, the controller is to determine a position attribute of the optical reflector.

19 Claims, 7 Drawing Sheets

300

```
┌─────────────────────────────────────────────────────────────────────┐
│ Driving an optical reflector, the optical reflector comprising a rotor, a first stator, and │
│  a second stator, the driving the optical reflector comprising: applying a first   │
│ actuation voltage to the first stator; and applying a second actuation voltage to the │
│                           second stator                            │
│                              305                               │
└─────────────────────────────────────────────────────────────────────┘
                                  ↓
┌─────────────────────────────────────────────────────────────────────┐
│              Applying an excitation voltage to the first stator              │
│                              310                               │
└─────────────────────────────────────────────────────────────────────┘
                                  ↓
┌─────────────────────────────────────────────────────────────────────┐
│ After the applying the first actuation voltage, the second actuation voltage, and the │
│   excitation voltage, determining a relationship between a first capacitance and a   │
│ second capacitance, the first capacitance corresponding to a capacitance between  │
│    the rotor and the first stator, and the second capacitance corresponding to a   │
│             capacitance between the rotor and the second stator             │
│                              315                               │
└─────────────────────────────────────────────────────────────────────┘
                                  ↓
┌─────────────────────────────────────────────────────────────────────┐
│ Determining a position attribute of the optical reflector based on the relationship │
│            between the first capacitance and the second capacitance            │
│                              320                               │
└─────────────────────────────────────────────────────────────────────┘
```

Fig. 3

CAPACITIVE ANGLE SENSING OF ELECTROSTATIC MEMS MIRRORS

CROSS-REFERENCE TO RELATED APPLICATION

The present application claims priority to U.S. Provisional Patent Application Ser. No. 63/004,616, entitled "SYSTEMS TO SPATIALLY MODULATE LIGHT AND METHODS OF OPERATING THEREOF" and filed on Apr. 3, 2020, the entirety of which is incorporated by reference herein.

BACKGROUND

Devices such as laser scanning projectors and the like, employ a collimated laser beam that scans across a flat surface in a raster or scan pattern to form images. These devices employ optical reflectors to deflect the beam to perform the scanning. These optical reflectors may be, or may include, Micro-Electro-Mechanical Systems ("MEMS") based devices. Determining the position attribute of the optical reflector becomes significant in some applications of the optical reflector. For example, when the optical reflector is implemented in laser scanning projection systems, the position attribute of the optical reflector may need to be accounted for to project an image or to optimize quality of a projected image.

BRIEF DESCRIPTION OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

FIG. 3 shows a flowchart of an example method of determining a position attribute of the optical reflector, in accordance with a non-limiting implementation of the present specification.

DETAILED DESCRIPTION

Figure 1:
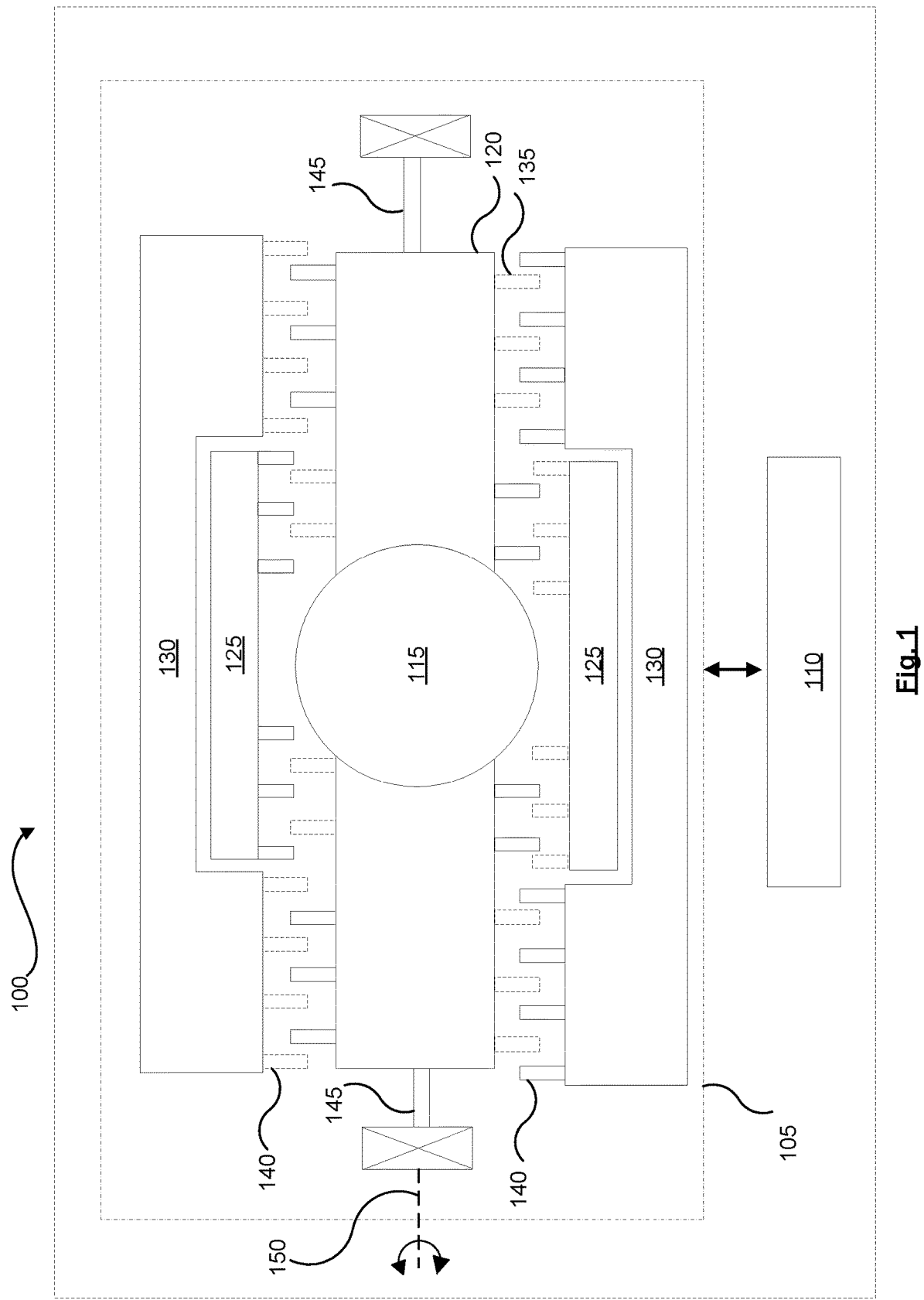
FIG. 1 shows a schematic representation of an example system to spatially modulate light, in accordance with a non-limiting implementation of the present specification.

In the following description, certain specific details are set forth in order to provide a thorough understanding of various disclosed implementations. However, one skilled in the relevant art will recognize that implementations may be practiced without one or more of these specific details, or with other methods, components, materials, and the like. In other instances, well-known structures associated with light sources have not been shown or described in detail to avoid unnecessarily obscuring descriptions of the implementations.

Unless the context requires otherwise, throughout the specification and claims which follow, the word "comprise" and variations thereof, such as, "comprises" and "comprising" are to be construed in an open, inclusive sense, that is as "including, but not limited to."

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

The headings and Abstract of the Disclosure provided herein are for convenience only and do not interpret the scope or meaning of the implementations.

Throughout this specification and the appended claims, the term "carries" and variants such as "carried by" are generally used to refer to a physical coupling between two objects. The physical coupling may be direct physical coupling (i.e. with direct physical contact between the two objects) or indirect physical coupling that may be mediated by one or more additional objects. Thus, the term carries and variants such as "carried by" are meant to generally encompass all manner of direct and indirect physical coupling, including without limitation: carried on, carried within, physically coupled to, secured to, and/or supported by, with or without any number of intermediary physical objects therebetween.

The present specification relates to spatial light modulators. In particular, the present specification discloses methods and systems to determine a position attribute of an optical reflector. In some examples, the optical reflector is one of the components of the spatial light modulator. In some examples, the position attribute of the optical reflector may include a position attribute of a rotor of the optical reflector. In some examples, the position attribute may include one or more of: a rotation position of the rotor, an angular displacement of the rotor, and an angle of the rotor relative to an inner stator or an outer stator, of the optical reflector.

In some examples, a scanning laser projector system may include a spatial light modulator to scan at least one laser beam over a display area: The spatial light modulator may include two optical reflectors. The two optical reflectors may include a horizontal scan mirror and a vertical scan mirror, which may scan in orthogonal directions to generate an output of the scanning laser projector system. The horizontal scan mirror may be a fast-axis mirror, and the vertical scan mirror may be a slow axis mirror. The fast-axis mirror may operate (e.g., scan) at a higher frequency than the slow axis mirror. In some examples, the slow-axis mirror is operated to scan in one direction over a display area for most of its movement period, and to quickly return to the original position during the remainder of the period. In other examples, the slow-axis mirror may oscillate according to a sinusoidal or triangular function. Further, the nomenclature of "horizontal" and "vertical" is not limiting: The fast-axis mirror and the slow-axis mirror may be in any appropriate orientation which allows a two-dimensional image to be projected.

Generally, an operation (e.g., scanning operation) of the slow axis mirror is synchronized with the fast axis mirror to generate an output at the scanning laser projector system. The operation of the slow axis mirror may be controlled, and thus synchronized with the fast axis mirror by determining (e.g., sensing) a position attribute of the slow axis mirror. The position attribute of the slow axis mirror may include a rotational position, angular displacement, or angle of the slow axis mirror. By determining the position attribute of the slow axis mirror, an angular displacement and velocity of the slow axis mirror may be controlled in a closed loop, while rejecting external disturbances.

Generally, a position sensing device (PSD) can be used to measure the angle or angular displacement of the mirror (e.g., slow axis mirror) optically. The PSD has a relatively large form factor, and suffers from high power consumption. Such PSDs may not be suitable for applications where small size and low power consumption are required. For example, employing the PSD may not be suitable for wearables, such as but not limited to, a wearable heads-up display (WHUD).

The present specification discloses methods and systems to determine a position attribute of an optical reflector (e.g., slow axis mirror of a scanning laser projector). The systems and methods disclosed herein may obviate the need for a separate optical PSD, and as such may provide savings to size, weight, or power consumption of a device or system which may incorporate the optical reflector.

FIG. 1 shows a schematic representation of an example system 100 to spatially modulate light (referred to as "system" henceforth), in accordance with a non-limiting implementation of the present specification. The system 100 includes an optical reflector 105 and a controller 110. The optical reflector 105 includes a rotor 120, and inner stators 125 (referred to as the stator 125, henceforth), and outer stators 130 (referred to as stator 130, henceforth). In this disclosure, in some examples, the inner stator 125 may also be referred to as the first stator, and the outer stator 130 may also be referred to as the second stator. Although FIG. 1 shows two inner stators 125 and two outer stators 130, it is contemplated that the optical reflector 105 may include other arrangements of stators and rotor, or a different number of stators. In some examples, the optical reflector 105 may include a rotor, one inner stator, and one outer stator.

The rotor 120 may include a mirror 115. In some examples, the mirror 115 may include a metallic coating, such as but not limited to an aluminum (Al) coating. The rotor 120 and the stators 125, 130 may cooperate to form an actuator for the optical reflector 105.

The rotor 120 rotates or oscillates about its axis, hence rotating or oscillating the mirror 115 with respect to the stator 125. The rotor 120, and thus mirror 115 rotates or oscillates about its axis 150 through a pair of torsional bars 145. In some examples, the torsional bars 145 may include torsional hinges.

In some examples, the rotor 120 may be a comb-shaped rotor, and the stators 125, 130 may be comb-shaped stators. The comb-shaped rotor 120 may have outwardly projecting structures 135. The structures 135 may interdigitate with projecting structures 140 of the comb-shaped stator 125, and projecting structures of the comb-shaped stator 130. Structures 135 may project towards projecting structures 140 of stators 125 and 130. The structures 135 may be referred to as rotor combs 135, and the structures 140 may be referred to as stator combs 140. The rotor combs 135 may interdigitate with the stator combs 140 to form comb drives providing an electrostatic actuation mechanism for the optical reflector 105.

FIG. 1 shows a top plan view or perspective of system 100. From this perspective, the rotor 120, and the stators 125, and 130 define a plane, when the rotor 120 is in its neutral position (e.g., when the rotor 120 is in its resting position). In some examples, the stator combs 140 of the stator 125 may be offset in the out-of-plane direction from the stator combs 140 of the stator 130. Moreover, the combs of rotor 120 may also be variously offset in the out-of-plane direction relative to the combs of stators 125 and 130. In FIG. 1, dashing is used to indicate the comb (teeth) that are further into the page or further away from the viewer in the top perspective shown in FIG. 1. The comb (teeth) shown in solid lines are closer to the viewer in the top perspective shown in FIG. 1. These relative positions of the comb (teeth) describe the relative positions of the combs when rotor 120 is in its neutral or resting position. Such a neutral or resting position may be the position of rotor 120 relative to the stators 125, 130 when no electrical potential is applied between rotor 120 and the stators 125, 130.

Moreover, the relative positions of the comb teeth of rotor 120 and stators 125 and 130 may allow the electrostatic actuator formed between rotor 120 and stator 125 to rotate or deflect rotor 120 about axis 150 of rotation in a first direction, and the electrostatic actuator formed between rotor 120 and stator 130 to rotate or deflect rotor 120 about axis 150 of rotation in a second direction opposite the first direction. In other words, applying a voltage between rotor 120 and stator 125 may attract the comb teeth of rotor 120 and stator 125 towards each other, thereby rotating or deflecting rotor 120 about axis 150 in the first direction. This movement or deflection may also increase the distance or separation between the comb teeth of rotor 120 and stator 130, and may decrease the surface area between rotor 120 and stator 130. As such, deflection or rotation of rotor 120 in the first direction may cause an increase in the capacitance between rotor 120 and stator 125, while decreasing the capacitance between rotor 120 and stator 130.

Similarly, applying a voltage between rotor 120 and stator 130 may attract the comb teeth of rotor 120 and stator 130 towards each other, thereby rotating or deflecting rotor 120 about axis 150 in the second direction. This movement or deflection may also increase the distance or separation between the comb teeth of rotor 120 and stator 125, and may decrease the surface area between rotor 120 and stator 125. As such, deflection or rotation of rotor 120 in the second direction may cause an increase in the capacitance between rotor 120 and stator 130, while decreasing the capacitance between rotor 120 and stator 125. Furthermore, since rotor 120 may oscillate about axis 150 and may not be able to rotate freely through 360 degrees about axis 150, axis 150 of rotation may also be described as axis 150 of oscillation.

The rotor 120 and the stators 125, 130 are shown as a comb-shaped rotor and comb-shaped stators respectively in FIG. 1. It is contemplated that in some examples, the rotor 120 and the stators 125, 130 may not be comb-shaped, and may have other shapes.

For operation, the optical reflector 105 may be driven by an electrical signal which may cause rotation of the rotor relative to the stator(s).

In some examples, the actuation principle for the optical reflector 105 is electrostatic, where a potential difference is applied between the rotor 120 and the stator 125 or between the rotor 120 and stator 130. As discussed above, the potential difference applied between the rotor 120 and the stator 125 may cause movement (e.g., oscillation) of the rotor in a first direction. The potential difference applied between the rotor 120 and the stator 130 may cause movement (e.g., oscillation) of the rotor in a second direction, which may be opposite to the first direction.

For example, a voltage may be applied between the rotor combs 135 and the stator combs 140 (of the stator 125 or stator 130). In this state, the rotor combs 135 and corresponding the stator combs 140 interdigitate. The applied voltage attracts the rotor 120 to the stator 125 or stator 130 forcing the mirror 115 to tilt. In other words, when a voltage is applied between the rotor 120 and the stator 125 or stator 130, a torque is developed from the electrostatic field causing the rotor 120 to rotate about the torsional bars 145 toward or away from the stator 125 or stator 130 until the electrostatic torque is balanced by the restoring mechanical torque of the torsional bars 145, or until the driving voltage is turned off or reversed.

In addition, system 100 may include a controller 110 in communication with the optical reflector 105. Controller 110 may control the optical reflector 105. In some examples, the controller 110 may drive the optical reflector by providing actuation signals to the optical reflector 105. Furthermore, the controller 110 may determine a position attribute of the optical reflector 105, which is explained in detail in relation to FIGS. 3, 4, and 5. Also, where the system 100 is integrated into or forms a scanning or image projection system, such as but not limited to a scanning laser projector, the controller 110 may modify projection of an image to be projected using the optical reflector 105 based on the position attribute of the optical reflector 105.

In some examples, the controllers described herein such as controller 110 may include at least one processor in communication with at least one non-transitory processor-readable medium. The processor-readable medium may include instructions to cause the processors to control the optical reflector 105 as described in relation to the methods and systems described herein. Moreover, in some examples the controllers may be free-standing components, while in other examples the controllers may include functional modules incorporated into other components of their respective systems.

Additionally, the controller 110 may include circuitry and components to control the optical reflector 105. For example, the controller 110 may include circuitry and components to drive the optical reflector 105, and to determine a position attribute of the optical reflector 105, among other functions.

Furthermore, in some examples the controllers or their functionality may be implemented in other ways, including: via Application Specific Integrated Circuits (ASICs), in standard integrated circuits, as one or more computer programs executed by one or more computers (e.g., as one or more programs running on one or more computer systems), as one or more programs executed by on one or more controllers (e.g., microcontrollers), as one or more programs executed by one or more processors (e.g., microprocessors, central processing units, graphical processing units), as firmware, and the like, or as a combination thereof.

In some examples, the system 100 may be implemented as micro-electro-mechanical systems (MEMS) based system. For example, the optical reflector 105 may include a MEMS based optical reflector.

In some examples, the optical reflector 105 may be implemented as a slow axis mirror (vertical scan mirror) of a scanning laser projector.

Figure 2:
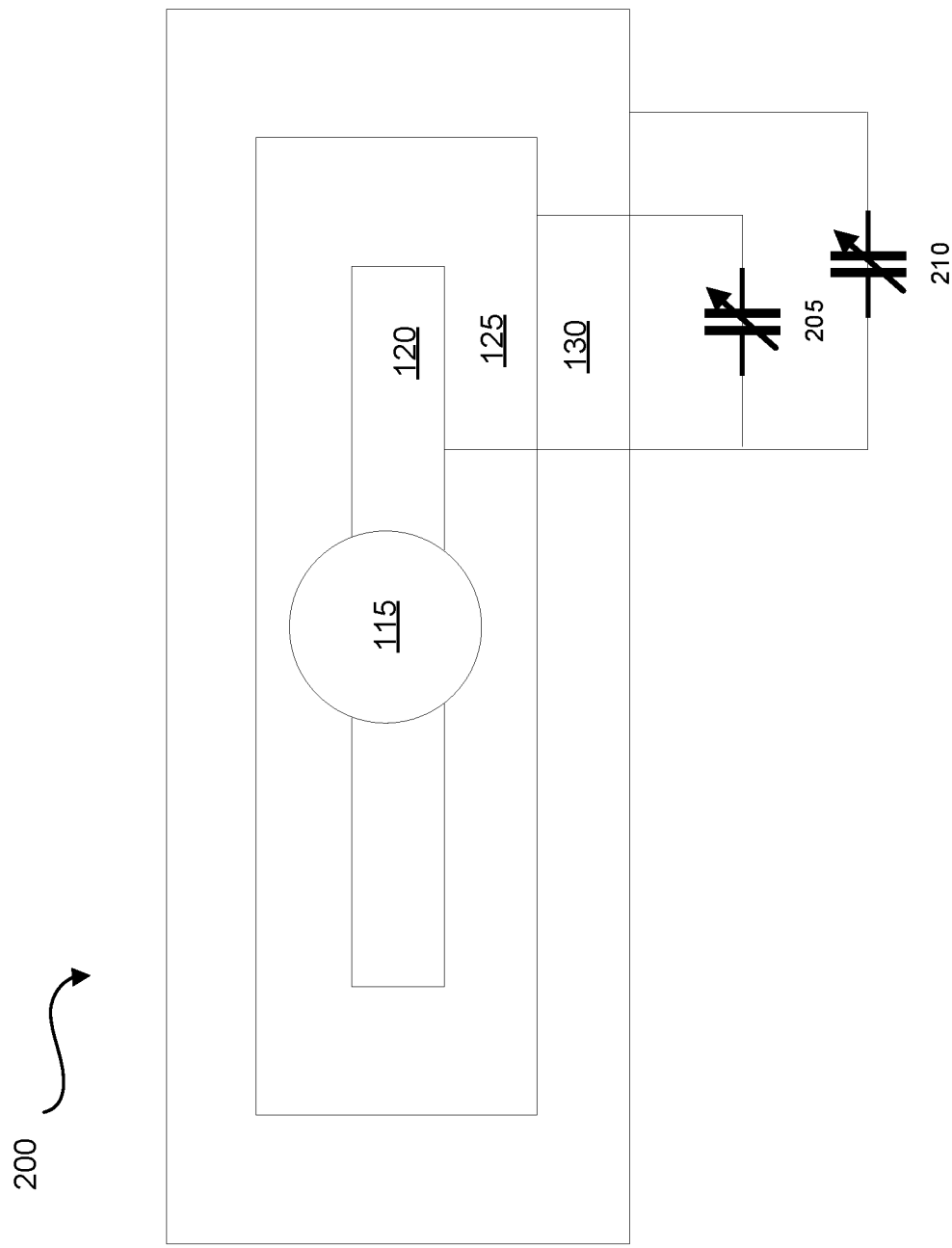
FIG. 2 shows an example illustration of capacitances associated with an optical reflector, in accordance with a non-limiting implementation of the present specification.

Turning now to FIG. 2, an example 200 of capacitances associated with the optical reflector 105 is illustrated. As can be seen in FIG. 2, the rotor 120 and the stator 125 may form a capacitance 205 between them, and the rotor 120 and the stator 130 may form a capacitance 210 between them. In some examples, the first capacitance 205 and the second capacitance 210 may include parasitic capacitance of about 2 to 4 pF. In some other examples, the parasitic capacitances may have some other values.

Depending on the position of the rotor 120 relative to the stators 125, 130 (e.g., due to offset between the rotor combs 135 or stator combs 140 as described above), there is a difference in the capacitance 205 between the rotor 120 and the stator 125, and a capacitance 210 between the rotor 120 and the stator 130. For example, when the optical reflector rotates in a first direction, the capacitance 205, also referred to as a first capacitance, between the rotor 120 and the stator 125 increases due to decreased distance and/or increased surface area between the rotor 120 and the stator 125, and the capacitance 210, also referred to as a second capacitance, between the rotor 120 and the stator 130 decreases due to increased distance and/or decreased surface area between the rotor 120 and the stator 130. Similarly, when the optical reflector rotates in another direction, which may be opposite to the first direction, the first capacitance 205 decreases, and the second capacitance 210 increases.

This difference in capacitances may be used to determine a position attribute of the optical reflector 105. In some examples, the relationship between the first capacitance 205 and the second capacitance 210 may be used to determine one or more of a rotation position, an angular displacement, and an angle, of the optical reflector 105, which is explained in detail in relation to FIGS. 3, 4, and 5.

Turning now to FIG. 3, a flowchart of an example method 300 of determining a position attribute of the optical reflector is shown. In such examples, the position attribute may include one or more of a rotation position, an angular displacement, and an angle, of the optical reflector 105. As stated above, in some examples, the position attribute of the optical reflector 105 may include a position attribute of the rotor 120 of the optical reflector 105. In some examples, the position attribute may include one or more of: a rotation position of the rotor 120, an angular displacement of the rotor 120, and an angle of the rotor 120 relative to the inner stator 125 or the outer stator 130, of the optical reflector 105.

In some examples, the position attribute may be determined by the controller 110. In such examples, the controller 110 may perform or control the performance of operations described herein in relation to FIG. 3.

Turning now to method 300, at box 305, an optical reflector is driven by application of a first actuation voltage to a first stator, and application of a second actuation voltage to a second stator. The optical reflector includes a rotor, a first stator, and a second stator. In some examples, the first stator may be an inner stator, and the second stator may be an outer stator, of the optical reflector. In some other examples, the first stator may be an outer stator, and the second stator may be an inner stator. For example, the first actuation voltage may be applied to the stator 125, and the second actuation voltage may be applied to the stator 130 to drive the optical reflector 105.

In some examples, the first actuation voltage may be applied to the first stator through a first rated resistor, and the second actuation voltage may be applied to the second stator through a second rated resistor. The first rated resistor and the second rated resistor may be high-voltage rated isolated resistors. The rating of the resistors may depend upon values of the first actuation voltage and the second actuation voltage. The application of actuation voltages through the rated resistors in explained in greater detail in relation to FIG. 4 below.

In some examples, the optical reflector may be a micro-electro-mechanical system (MEMS) based optical reflector, and driving the optical reflector may include driving the MEMS based optical reflector. For example, the optical reflector 105 may be a MEMS based optical reflector.

At box 310, an excitation voltage is applied to the first stator. In some examples, the excitation voltage may be applied to the stator 125 of the optical reflector 105. Moreover, in some examples, the excitation voltage may be applied to the stator 130 of the optical reflector 105.

In some examples, the first actuation voltage may be applied to the first stator by applying a low frequency high voltage (LFHV) signal (first LFHV signal) to the first stator, and the second actuation voltage may be applied to the second stator by applying another LFHV signal (second LFHV signal) to the second stator. In some examples, a frequency and a voltage of the first LFHV signal may be same as a frequency and voltage of the second LFHV signal respectively. In some other examples, the frequency and the voltage of the first LFHV signal may be different than the frequency and the voltage of the second LFHV signal respectively.

In some examples, the excitation voltage may be applied to the first stator by applying a high frequency low voltage (HFLV) signal to the first stator. A voltage of the HFLV signal is lower than respective voltages of each of the first LFHV signal and the second LFHV signal, and a frequency of the HFLV signal is higher than respective frequencies of the first LFHV signal and the second LFHV signal.

In some examples, the HFLV signal may be applied to the first stator through an amplifier connected across the second stator, and an AC-coupling capacitor connected in series with a first capacitance, which is the capacitance between the rotor and the first stator. The application of the HFLV signal is explained in greater detail in relation to FIG. 4 below.

At box 315, after the application of the first actuation voltage, the second actuation voltage, and the excitation voltage, a relationship may be determined between a first capacitance, and a second capacitance. The first capacitance corresponds to a capacitance between the rotor and the first stator, and the second capacitance corresponds to a capacitance between the rotor and the second stator. For example, a relationship between the first capacitance 205 between the rotor 120 and the first stator 125, and the second capacitance 210 between the rotor 120 and the second stator 130 may be determined.

In some examples, the relationship may include a difference between the first capacitance and the second capacitance. Moreover, in some examples, the relationship may include a ratio of the first capacitance to the second capacitance, or a ratio of the second capacitance to the first capacitance.

In some examples, a relationship may be determined between the first capacitance and the second capacitance by determining a gain of the amplifier which is connected across the second stator, and through which the excitation voltage is applied to the first stator. The gain of the amplifier may be a function of the first capacitance, the second capacitance, and a capacitance of the AC-coupling capacitor which is connected in series with the first capacitance, and through which the excitation voltage is applied to the first stator. By determining the gain of the amplifier and knowing the value of the capacitance of the AC-coupling capacitor, which may be a fixed value, a relationship between the first capacitance and the second capacitance may be determined. The gain of the amplifier, and thus relationship between the first capacitance and the second capacitance may be determined as explained in greater detail in relation to FIG. 4.

Figure 5:
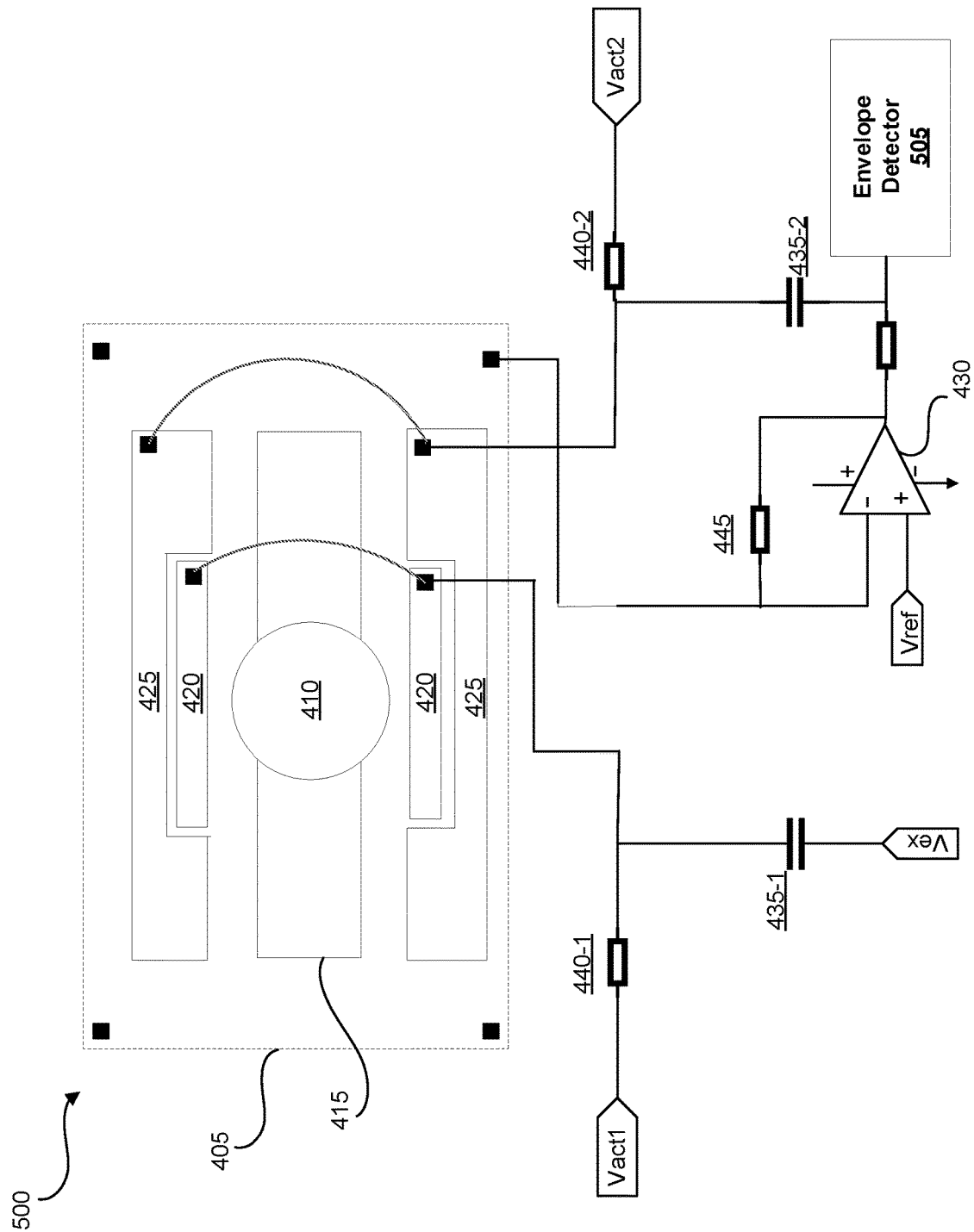
FIG. 5 shows a schematic of another example system, which may be used to determine the position attribute of the optical reflector, in accordance with a non-limiting implementation of the present specification.

In some examples, the gain of the amplifier may be determined by determining an amplitude of the excitation voltage at an output of the amplifier. In some examples, the amplitude of the excitation voltage at the output of the amplifier may be measured by an envelope detector (for example as shown in FIG. 5). The envelope detector may demodulate the output of the amplifier.

In some examples, the amplifier may include a feedback amplifier which may be connected across the second stator and the AC-coupling capacitor. The second capacitance and the capacitance of the AC-coupling capacitor may act as a feedback loop for the feedback amplifier. As stated above for the amplifier, the gain of the feedback amplifier may be a function of the first capacitance, the second capacitance, and the capacitance of the AC-coupling capacitor.

At box 320, a position attribute of the optical reflector may be determined based on the relationship between the first capacitance and the second capacitance. For example, the position attribute of the optical reflector 105 may be determined by the controller 110. The position attribute may include one or more of: a rotation position, an angular displacement, and an angle, of the optical reflector. In some examples, the rotation position, the angular displacement, and the angle may include a rotation position, an angular displacement, and an angle of a rotor relative to an inner stator or outer stator. For example, the position attribute of the optical reflector 105 may include a rotation position of the rotor 120, an angular displacement of the rotor 120, and an angle of the rotor 120 or the mirror 115 relative to the stator 125 or stator 130.

In some examples, the operation of the optical reflector may be modified based on the position attribute of the optical reflector. In some examples, where the optical reflector 105 is implemented as a slow axis mirror of a scanning laser projector, the rotation of the optical reflector 105 may be synchronized with another optical reflector, which may be a fast axis mirror of the scanning laser projector, based on the determined position attribute of the optical reflector 105.

Further, in examples, where the optical reflector is used to project images, the projection of an image may be modified based on the position attribute of the optical reflector. For example, the optical reflector 105 may be used in the system 600 (shown in FIG. 6) to project images. The image may be projected by accounting for the position attribute of the optical reflector 105, where the position attribute may be determined based on the method 300 as stated above.

Figure 4:
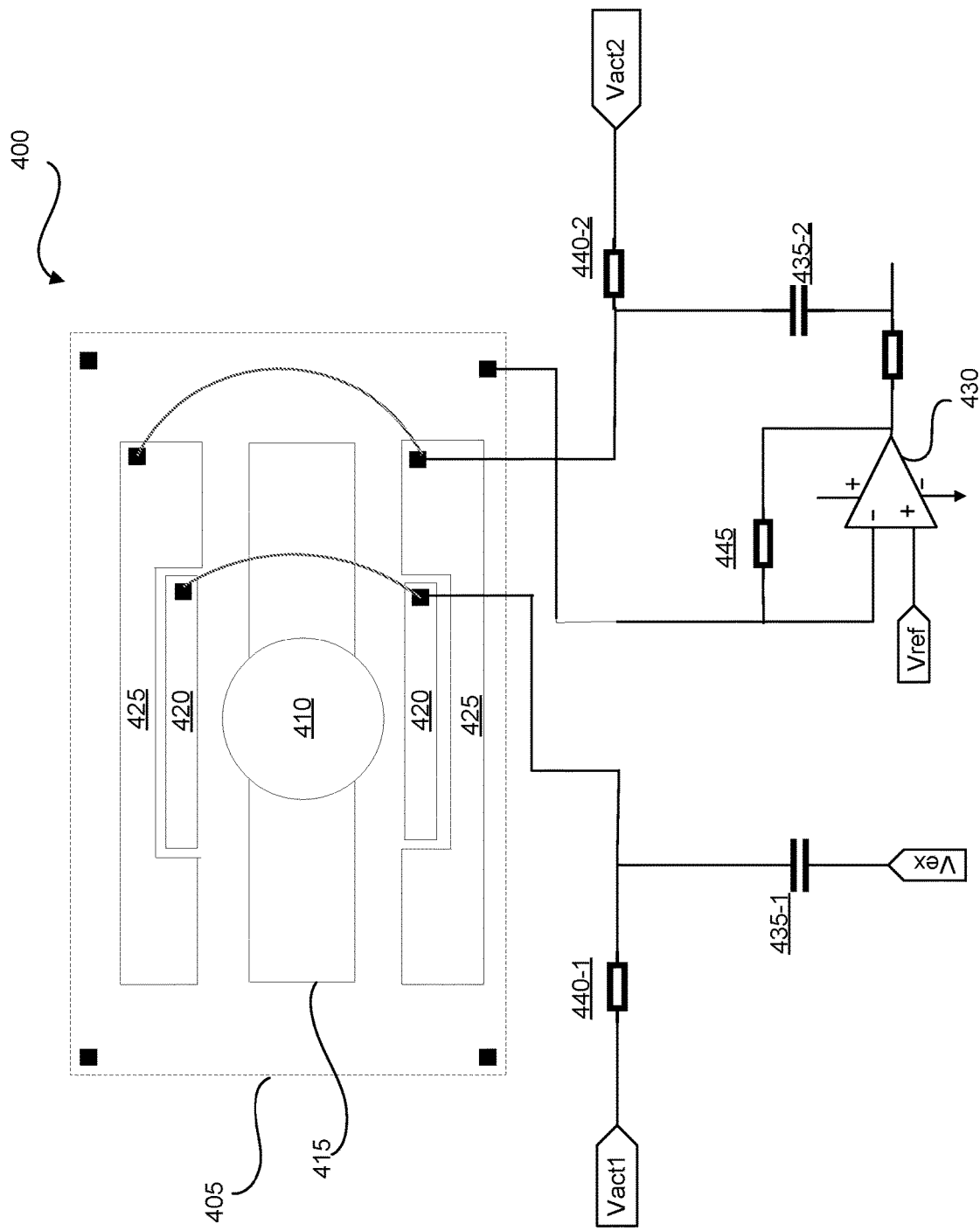
FIG. 4 shows a schematic of an example system, which may be used to determine the position attribute of the optical reflector, in accordance with a non-limiting implementation of the present specification.

Turning now to FIG. 4, a schematic representation of an example system 400 is shown. System 400 may be employed for determining a position attribute of the optical reflector 405. The optical reflector 405 may be similar to optical reflector 105, and may include rotor 415 (similar to rotor 120) having mirror 410 (similar to mirror 115), first stators 420 (similar to stators 125) and second stators 425 (similar to stators 130). For the sake of brevity, some components of the optical reflector such as rotor combs, stator combs, and torsional springs are not shown in FIG. 4. As shown in FIG. 4, two high voltage isolation circuits are connected to each respective stator 420, 425 in order to protect a low-voltage sensing circuit (e.g., including amplifier 430) from the high voltage actuation signals, as well as to provide separate inputs for HFLV excitation signal and LFHV actuation signals.

The first capacitance may correspond to a capacitance between the rotor 415 and the first stator 420 of an optical reflector 405, and the second capacitance may correspond to a capacitance between the rotor 415 and the second stator 420 of the optical reflector 405. As can be seen in FIG. 4, an amplifier 430 may be connected across the second stator 425. The amplifier 430 may be an op-amp acting as a variable gain amplifier (VGA), modulator, or a feedback amplifier. An AC-coupling capacitor 435-1 may be connected in series with the first capacitance (the capacitor 435-1 connected with the first stator 420). In some examples, another AC-coupling capacitor 435-2 may be connected in series with the second capacitance (the capacitor 435-2 connected with the second stator 425). The AC-coupling capacitors 435 may be positioned to prevent high voltage actuation signals from damaging the low-voltage sensing circuit (including the amplifier 430).

As can be seen in FIG. 4, a first actuation voltage (Vact1) may be applied to the first stator 420 through a first rated resistor 440-1, and a second actuation voltage (Vact2) may be applied to the second stator 425 through another rated resistor 440-2. The first actuation voltage (Vact1) may cause rotation of the rotor 415 and mirror 410. The first resistor 440-1 and the second resistor 440-2 may be high voltage-rated resistors, the rating of which may depend on the first actuation voltage (Vact1) and the second actuation voltage (Vact2).

As stated above, the first actuation voltage (Vact1) may correspond to a first high voltage actuation signal (first LFHV signal), and the second actuation voltage may correspond to a second high voltage actuation signal (second LFHV signal).

As can be further seen in FIG. 4, the excitation voltage (Vex) may be applied to the first stator 420, through the AC-coupling capacitor 435-1. The excitation voltage may act as a carrier signal, the magnitude of which is varied based on the relationship between the first capacitance and the second capacitance. For example, the magnitude of the excitation voltage (Vex) may be varied by the ratio of the first capacitance to the second capacitance.

The excitation voltage (Vex) may correspond to the high frequency low voltage (HFLV) signal, which may not rotate the optical reflector because of its low voltage, and its frequency being higher than resonant or response frequencies of the optical reflector. For example, the HFLV signal applied to the first stator 420 may not rotate the rotor 415 or mirror 410 of the optical reflector 405.

The value of the excitation voltage (Vex) signal at the output of the amplifier 430 may be determined, which may be indicative of the gain of the amplifier 430. The gain of the amplifier may depend on the ratio of the first capacitance to the second capacitance. For example, the excitation voltage (Vex) may be amplified when the first capacitance is greater than the second capacitance, as the rotor 415 or mirror 410 of the optical reflector 405 rotates in a first direction. In another example, the excitation voltage (Vex) may be attenuated when the first capacitance is smaller than the second capacitance, as the rotor 415 or mirror 410 of the optical reflector 405 rotates in a second direction, which may be opposite to the first direction. By measuring the amplitude of the excitation voltage (Vex) e.g., HFLV excitation signal at the output of the amplifier 430, the position attribute of the optical reflector 405 may be determined. The position attribute may include rotational position, angular displacement, or angle of the rotor relative to the stator.

The gain of the amplifier 430 may be expressed as:

$$\text{Gain} = -\frac{\text{feedback impedance}}{\text{input impedance}}$$

The input reactance (e.g., input impedance) may be formed by the first capacitance (between the rotor 415 and the stator 420) and the first AC-coupling capacitor 435-1. The feedback reactance (e.g., feedback impedance) may be formed by the second capacitance (between the rotor 415 and the stator 425) and the second AC-coupling capacitor 435-2. For the LVHF excitation signal Vex, the input capacitance includes capacitance of the AC-coupling capacitor 435-1 ($C_{s1}$) and the first capacitance ($C_{m1}$) in series, and the feedback capacitance includes capacitance of the AC-coupling capacitor 435-2 ($C_{s2}$) and the second capacitance ($C_{m2}$) in series, where the AC-coupling capacitors 435-1, 435-2 can be of the same value (Cs). Consequently, the impedances would be:

$$\text{input impedance} = \frac{1}{\omega C_{m1}} + \frac{1}{\omega C_s} = \frac{C_{m1} + C_s}{\omega C_{m1} C_s}$$

$$\text{feedback impedance} = \frac{1}{\omega C_{m2}} + \frac{1}{\omega C_s} = \frac{C_{m2} + C_s}{\omega C_{m2} C_s}$$

Putting these into the gain equation yields:

$$\text{Gain} = -\frac{\frac{C_{m2} + C_s}{\omega C_{m2} C_s}}{\frac{C_{m1} + C_s}{\omega C_{m1} C_s}} = -\frac{C_{m1}(C_{m2} + C_s)}{C_{m2}(C_{m1} + C_s)}$$

Since $C_{s1}$ and $C_{s2}$ are of the same value, and $C_{m1}$ and $C_{m2}$ are complementary to each other, the position attribute of the optical reflector may be determined by determining a gain of the amplifier. The gain of the amplifier 430 which is a function of a relationship between the first capacitance and the second capacitance is thus indicative of the position attribute of the optical reflector, since the position attribute of the optical reflector is also a function of the relationship between the first capacitance and the second capacitance.

In some examples, the value of one of the first capacitance and the second capacitance may be fixed, which may allow a value of the other of the first capacitance and the second capacitance to be determined.

Hence, by determining the gain of the amplifier 430 (indicative of a relationship between the first capacitance and the second capacitance), the position attribute of the optical reflector may be determined.

It is contemplated that (direct current) DC gain of the amplifier 430 is zero because the input resistance to the amplifier 430 is very high (e.g., close to infinite), but the feedback resistance to the amplifier 430 is finite e.g., due to resistor 445. The feedback resistor 445 provides DC current path, but has no effect on (alternating current) AC gain, while the DC gain is set to be zero.

Turning now to FIG. 5, a schematic of an example system 500 that may be used to determine a gain of the amplifier 430 is shown in FIG. 5. As seen in FIG. 5, the output of the amplifier 430, which is an amplitude modulated excitation voltage (Vex) signal is fed to an envelope detector 505. The envelope detector 505 may demodulate the amplitude-modulated signal. Hence, the output of the envelop detector 505 may be proportional to a position attribute, such as but not limited to, an angle of the optical reflector (e.g., angle of the rotor), e.g., rotor 415. By measuring the demodulated output of the envelope detector 505, the position attribute of the optical reflector 405 may be determined.

Figure 6:
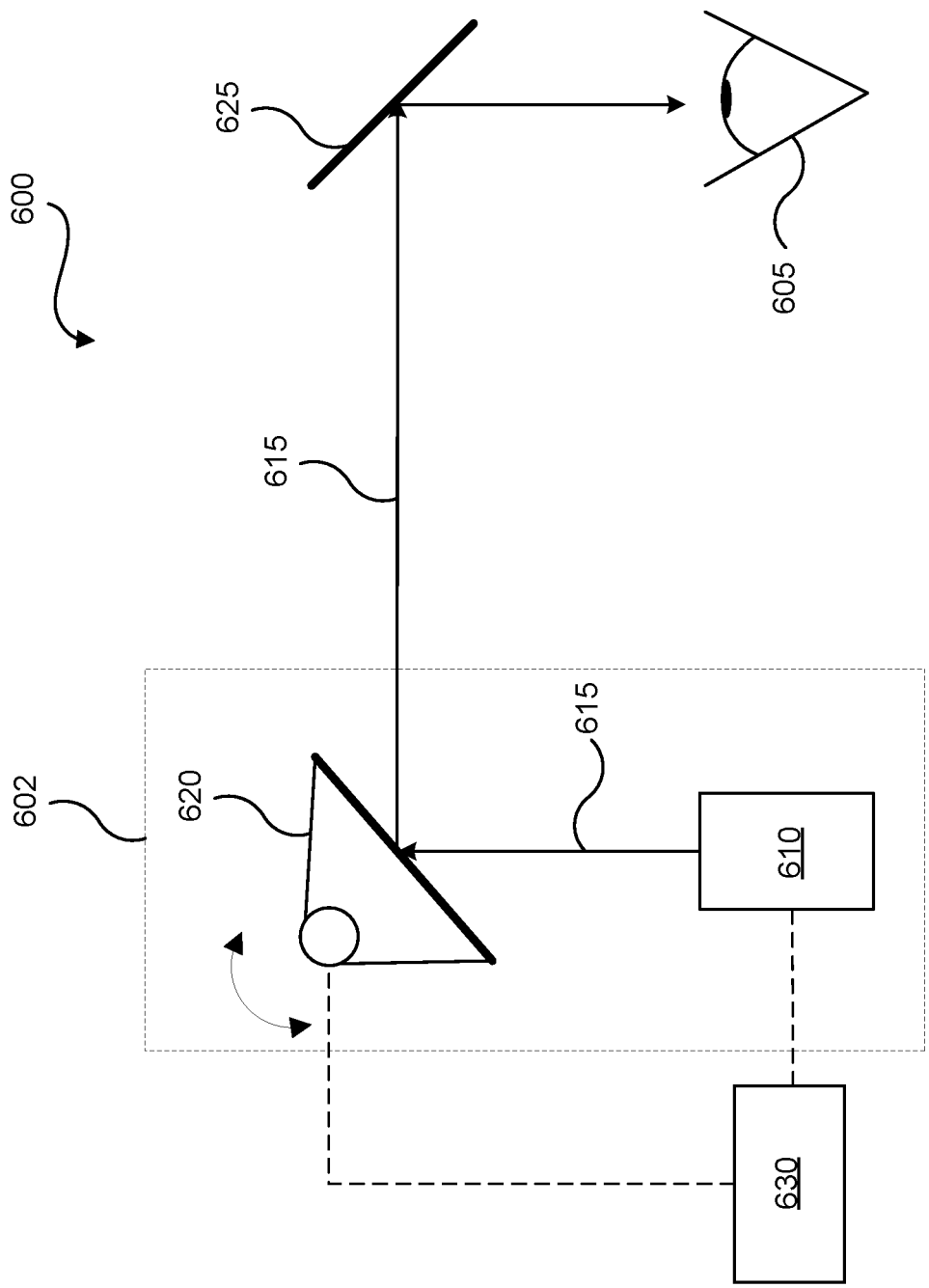
FIG. 6 shows a schematic representation of an example system which may be used to generate an image, in accordance with a non-limiting implementation of the present specification.

Turning now to FIG. 6, a schematic representation is shown of an example system 600, which may incorporate system 100. System 600 may be used to form or project an image viewable by an eye 605 of a viewer. System 600 may also be referred to or described as an image projection device (e.g., scanning laser projector), a display device, a display system, or a display. The viewer may also be described as a user of system 600. System 600 may include a light engine 602 to generate a beam of output light 615. In some examples, light engine 602 may include a light source 610 to generate output light 615. Light source 610 may include at least one laser, at least one light emitting diode, and the like. Light engine 602 may also include a spatial modulator 620 to receive output light 615 from light source 610. In some examples, spatial modulator 620 may include a movable reflector, a micro-electro-mechanical system (MEMS), a digital micromirror device (DMD), and the like. In some examples, spatial modulator 620 may include an optical reflector 105 or entirety of system 100. In some examples, spatial modulator 620 may include both a fast-axis mirror and a slow axis mirror.

Furthermore, system 600 may include a display optic 625 to receive output light 615 from light engine 602 and direct the output light towards eye 605 of a viewer to form an image viewable by the user. Moreover, in some examples system 600 may be a part of or incorporated into a wearable heads-up display (WHUD). Such a heads-up display may have different designs or form factors, such as the form factor of eyeglasses, as is described in greater detail in relation to FIG. 7. In examples where system 600 is in the form factor of glasses, display optic 625 may be on or in a lens of the glasses.

In addition, system 600 includes a controller 630 in communication with the light engine 602. Controller 630 may control the light engine 602 to project an image. In some examples, the image to be projected may be a still image, a moving image or video, an interactive image, a graphical user interface, and the like. In some examples, the controller 630 may include the controller 110. In such examples, the controller 630 may control the optical reflector 105 (which may be implemented as spatial modulator 620 or as a component of spatial modulator 620), which optical reflector 105 is described above in relation to FIGS. 1-5.

In some examples, the controllers described herein such as controller 630 may include at least one processor in communication with at least one non-transitory processor-readable medium. The processor-readable medium may include instructions to cause the processors to control the light source and the spatial modulator as described in relation to the methods and systems described herein. Moreover, in some examples the controllers may be free-standing components, while in other examples the controllers may include functional modules incorporated into other components of their respective systems.

Furthermore, in some examples the controllers or their functionality may be implemented in other ways, including: via Application Specific Integrated Circuits (ASICs), in standard integrated circuits, as one or more computer programs executed by one or more computers (e.g., as one or more programs running on one or more computer systems), as one or more programs executed by on one or more controllers (e.g., microcontrollers), as one or more programs executed by one or more processors (e.g., microprocessors, central processing units, graphical processing units), as firmware, and the like, or as a combination thereof.

Figure 7:
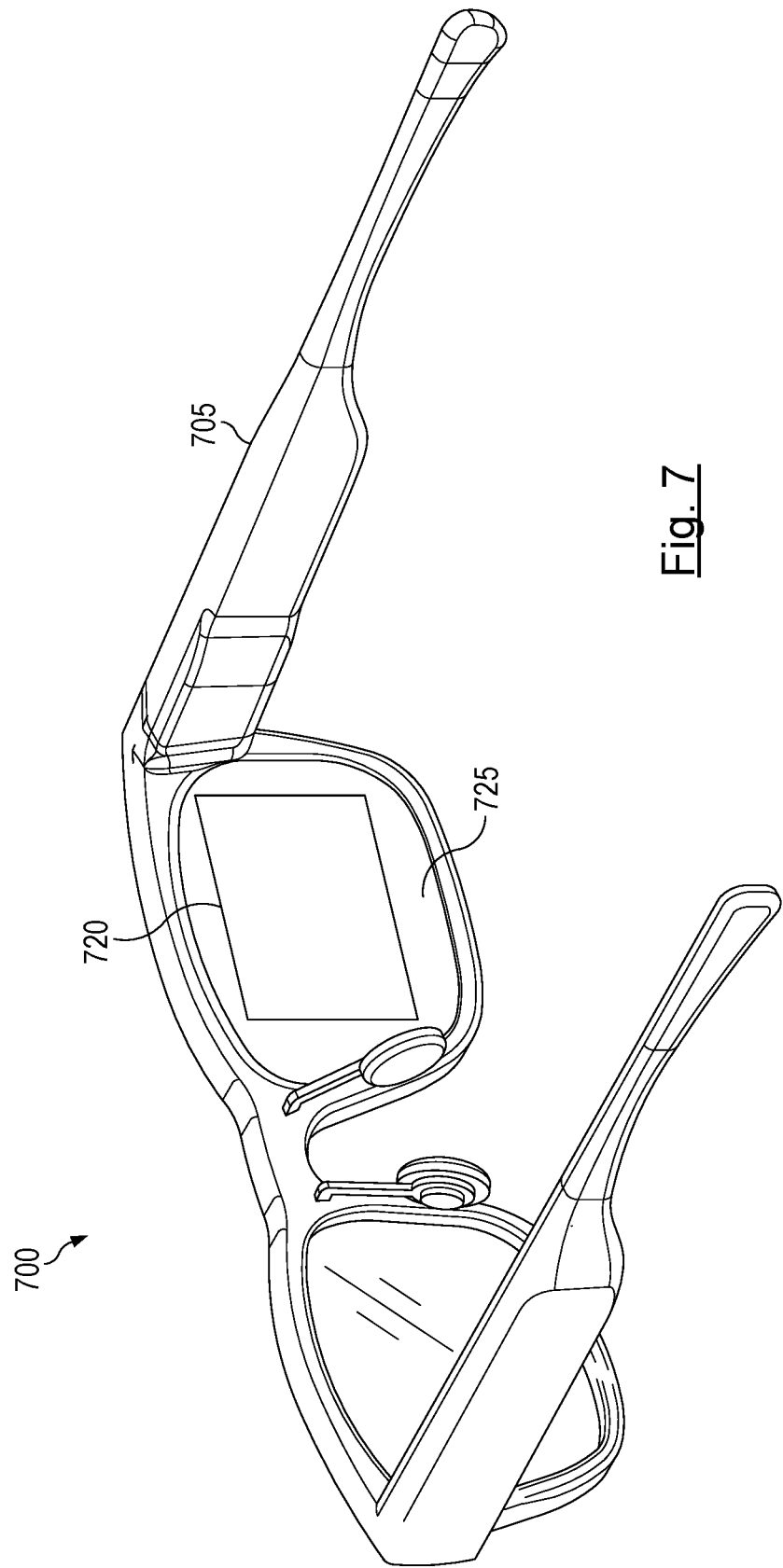
FIG. 7 shows a partial-cutaway perspective view of an example wearable heads-up display, in accordance with a non-limiting implementation of the present specification.

Turning now to FIG. 7, a partial-cutaway perspective view of an example wearable heads-up display (WHUD) 700 is shown. WHUD 700 includes a support structure 705 that in use is worn on the head of a user and has the general form factor and appearance of an eyeglasses (e.g. sunglasses) frame. Eyeglasses or sunglasses may also be generically referred to as "glasses". Support structure 705 may carry components of a system to display an image, such as system 100, and/or system 600. For example, the light source module may be received in a space in a side arm of support structure 705. In other examples, one or more of the image projection and output light adjustment system components or systems described herein may be received in or carried by support structure 705.

The spatial modulator of the systems 100, 600 described herein may be received in or be part of a component of support structure 705. The spatial modulator in turn may direct the output light onto a display optic 720 carried by a lens 725 of support structure 705. Moreover, in some examples, the display optic 720 may be similar in structure or function to display optic 625. Moreover, in some examples display optic 720 may include an optical incoupler, a waveguide, and an optical outcoupler.

It is contemplated that method 300 and the other methods described herein may be performed by system 100, system 600, WHUD 700, and the other systems and devices described herein. It is also contemplated that method 300 and the other methods described herein may be performed by systems or devices other than the systems and devices described herein. In addition, it is contemplated that system 100, system 600, WHUD 700, and the other systems and devices described herein may have the features and perform the functions described herein in relation to method 300 and the other methods described herein. Moreover, system 100, system 600, WHUD 700, and the other systems and devices described herein may have features and perform functions other than those described herein in relation to method 300 and the other methods described herein.

As disclosed herein, in some embodiments a method includes: driving an optical reflector, the optical reflector including a rotor, a first stator, and a second stator; and determining a position attribute of the optical reflector based on the relationship between a first capacitance and the second capacitance, the first capacitance corresponding to a capacitance between the rotor and the first stator, and the second capacitance corresponding to a capacitance between the rotor and the second stator. In one aspect, driving the optical reflector includes: applying a first low frequency high voltage (LFHV) signal to the first stator; and applying a second LFHV signal to the second stator.

In one aspect, driving the optical reflector includes: applying a high frequency low voltage (HFLV) signal to the first stator. In another aspect, the applying the HFLV signal includes: applying the HFLV signal to the first stator through an amplifier connected across the second stator, and an AC-coupling capacitor connected in series with the first capacitance. In yet another aspect, determining the relationship includes: determining a gain of the amplifier. In still another aspect, the determining the position attribute includes: determining the position attribute based on the gain of the amplifier. In another aspect, the determining the gain of the amplifier includes: determining an amplitude of an excitation voltage at an output of the amplifier.

In one aspect, the determining the amplitude includes: measuring the amplitude by an envelope detector to demodulate the output of the amplifier. In another aspect, the driving the optical reflector includes: driving a micro-electro-mechanical system (MEMS) based optical reflector. In yet another aspect, determining the position attribute includes: determining one or more of: a rotation position, an angular displacement, and an angle, of the optical reflector. In still another aspect, the method includes determining a gain of a feedback amplifier connected across the second stator and an AC-coupling capacitor, wherein the second capacitance and a capacitance of the AC-coupling capacitor act as a feedback loop for the feedback amplifier.

In some embodiments, a system to spatially modulate light includes: an optical reflector to reflect the light, the optical reflector including a rotor, a first stator, and a second stator; and a controller in communication with the optical reflector, the controller to: drive the optical reflector; and determine a position attribute of the optical reflector based on the relationship between a first capacitance and the second capacitance, the first capacitance corresponding to a capacitance between the rotor and the first stator, and the second capacitance corresponding to a capacitance between the rotor and the second stator. In one aspect, the controller is to drive the optical reflector by: applying a first low frequency high voltage (LFHV) signal to the first stator; and applying a second LFHV signal to the second stator. In another aspect, the controller is to drive the optical reflector by: applying a high frequency low voltage (HFLV) signal to the first stator.

In one aspect, the system includes an amplifier connected across the second stator, and an AC-coupling capacitor connected in series with the first capacitance and to apply the HFLV signal, the controller is to: apply the HFLV signal to the first stator through the amplifier and the AC-coupling capacitor. In another aspect, to determine the relationship, the controller is to: determine a gain of the amplifier. In still another aspect, to determine the position attribute, the controller is to: determine the position attribute based on the gain of the amplifier. In yet another aspect, to determine the gain of the amplifier, the controller is to: determine an amplitude of the excitation voltage at an output of the amplifier. In another aspect, the system includes an envelope detector; and to determine the amplitude, the controller is to: measure the amplitude using the envelope detector to demodulate the output of the amplifier.

In some embodiments, a head-wearable display device includes a micro-electro-mechanical system (MEMS) based optical reflector including a rotor, a first stator, and a second stator; and a controller in communication with the optical reflector, the controller to: determine a position attribute of the optical reflector based on the relationship between a first capacitance and the second capacitance, the first capacitance corresponding to a capacitance between the rotor and the first stator, and the second capacitance corresponding to a capacitance between the rotor and the second stator.

Throughout this specification and the appended claims, infinitive verb forms are often used. Examples include, without limitation: "to drive," "to apply," "to determine," and the like. Unless the specific context requires otherwise, such infinitive verb forms are used in an open, inclusive sense, that is as "to, at least, drive" to, at least, apply," "to, at least, determine," and so on.

The above description of illustrated example implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. Moreover, the various example implementations described herein may be combined to provide further implementations.

In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A method comprising:
   driving an optical reflector, the optical reflector comprising a rotor, a first stator, and a second stator, wherein one of the first stator and the second stator is positioned between the rotor and the other one of the first stator and the second stator, wherein driving the optical reflector comprises applying a first actuation voltage to the first stator and applying a second actuation voltage to the second stator; and
   determining a position attribute of the optical reflector based on a relationship between a first capacitance and a second capacitance, the first capacitance corresponding to a capacitance between the rotor and the first stator, and the second capacitance corresponding to a capacitance between the rotor and the second stator.

2. The method of claim 1, further comprising:
   applying the first actuation voltage to the first stator by applying a first low frequency high voltage (LFHV) signal to the first stator; and
   applying the second actuation voltage to the second stator by applying a second LFHV signal to the second stator.

3. The method of claim 2, wherein driving the optical reflector comprises:
   applying a high frequency low voltage (HFLV) signal to the first stator.

4. The method of claim 3, wherein the applying the HFLV signal comprises:
   applying the HFLV signal to the first stator through an amplifier connected across the second stator, and an AC-coupling capacitor connected in series with the first capacitance.

5. The method of claim 4, wherein the determining the relationship comprises:
   determining a gain of the amplifier.

6. The method of claim 5, wherein the determining the position attribute comprises:
   determining the position attribute based on the gain of the amplifier.

7. The method of claim 5, wherein the determining the gain of the amplifier comprises:
   determining an amplitude of an excitation voltage at an output of the amplifier.

8. The method of claim 7, wherein the determining the amplitude comprises:
   measuring the amplitude by an envelope detector to demodulate the output of the amplifier.

9. The method of claim 1, wherein determining the position attribute comprises:

determining one or more of: a rotation position, an angular displacement, and an angle, of the optical reflector.

10. The method of claim 1, further comprising:
determining a gain of a feedback amplifier connected across the second stator and an AC-coupling capacitor, wherein the second capacitance and a capacitance of the AC-coupling capacitor act as a feedback loop for the feedback amplifier.

11. A system to spatially modulate light, the system comprising:
an optical reflector to reflect the light, the optical reflector comprising a rotor, a first stator, and a second stator, wherein one of the first stator and the second stator is positioned between the rotor and the other one of the first stator and the second stator; and
a controller in communication with the optical reflector, the controller to:
drive the optical reflector by applying a first actuation voltage to the first stator and applying a second actuation voltage to the second stator; and
determine a position attribute of the optical reflector based on a relationship between a first capacitance and a second capacitance, the first capacitance corresponding to a capacitance between the rotor and the first stator, and the second capacitance corresponding to a capacitance between the rotor and the second stator.

12. The system of claim 11, wherein the controller is to drive the optical reflector by:
applying the first actuation voltage to the first stator by applying a first low frequency high voltage (LFHV) signal to the first stator; and
applying the second actuation voltage to the second stator by applying a second LFHV signal to the second stator.

13. The system of claim 12, wherein the controller is to drive the optical reflector by:
applying a high frequency low voltage (HFLV) signal to the first stator.

14. The system of claim 13, further comprising:
an amplifier connected across the second stator, and an AC-coupling capacitor connected in series with the first capacitance;
wherein to apply the HFLV signal, the controller is to:
apply the HFLV signal to the first stator through the amplifier and the AC-coupling capacitor.

15. The system of claim 14, wherein to determine the relationship, the controller is to:
determine a gain of the amplifier.

16. The system of claim 15, wherein to determine the position attribute, the controller is to:
determine the position attribute based on the gain of the amplifier.

17. The system of claim 15, wherein to determine the gain of the amplifier, the controller is to:
determine an amplitude of an excitation voltage at an output of the amplifier.

18. The system of claim 17, further comprising:
an envelope detector;
wherein to determine the amplitude, the controller is to:
measure the amplitude using the envelope detector to demodulate the output of the amplifier.

19. A head-wearable display device, comprising
a micro-electro-mechanical system (MEMS) based optical reflector including a rotor, a first stator, and a second stator, wherein one of the first stator and the second stator is positioned between the rotor and the other one of the first stator and the second stator; and
a controller in communication with the MEMS based optical reflector, the controller to:
drive the MEMS based optical reflector by applying a first actuation voltage to the first stator and applying a second actuation voltage to the second stator; and
determine a position attribute of the MEMS based optical reflector based on a relationship between a first capacitance and a second capacitance, the first capacitance corresponding to a capacitance between the rotor and the first stator, and the second capacitance corresponding to a capacitance between the rotor and the second stator.

* * * * *